United States Patent
Chen et al.

(10) Patent No.: US 8,462,840 B2
(45) Date of Patent: Jun. 11, 2013

(54) DIGITAL TO TIME CONVERTER AND DIGITAL TO TIME CONVERTING METHOD

(75) Inventors: Poki Chen, Taipei (TW); Juan-Shan Lai, Taipei (TW); Po-Yu Chen, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 959 days.

(21) Appl. No.: 12/548,398

(22) Filed: Aug. 26, 2009

(65) Prior Publication Data

US 2010/0183066 A1   Jul. 22, 2010

(30) Foreign Application Priority Data

Jan. 22, 2009   (TW) ............................... 98102442 A

(51) Int. Cl.
*H03K 7/04*   (2006.01)
(52) U.S. Cl.
USPC ............................ 375/239; 717/101; 375/376
(58) Field of Classification Search
None
See application file for complete search history.

(56) References Cited

U.S. PATENT DOCUMENTS

| | | | |
|---|---|---|---|
| 7,680,234 B2* | 3/2010 | Colby et al. | 375/376 |
| 2003/0210028 A1* | 11/2003 | Beach et al. | 324/76.16 |
| 2006/0018369 A1* | 1/2006 | Sanada et al. | 375/149 |
| 2006/0088137 A1* | 4/2006 | Jiang et al. | 375/371 |

* cited by examiner

*Primary Examiner* — Leon-Viet Nguyen
(74) *Attorney, Agent, or Firm* — Wang Law Firm, Inc.; Li K. Wang; Stephen Hsu

(57) ABSTRACT

A digital-to-time converter for generating a first and a second output signal separated by a predetermined delay includes first and second periodic signal generators, respectively, generating a first and a second periodic signal, a periodic signal synchronizer detecting a phase difference between the first and the second periodic signals, and first and second output pulse generators, respectively, starting a count of the first and the second periodic signals when a phase of the first periodic signal coincides with a phase of the second periodic signal. When a first value is counted, the first output pulse generator outputs a pulse as the first output signal, and when a second value is counted, the second output pulse generator outputs a pulse as the second output signal.

18 Claims, 14 Drawing Sheets

US 8,462,840 B2

DIGITAL TO TIME CONVERTER AND DIGITAL TO TIME CONVERTING METHOD

CROSS REFERENCE TO RELATED APPLICATIONS

This Application claims priority of Taiwan Patent Application No. 98102442, filed on Jan. 22, 2009, the entirety of which is incorporated by reference herein.

BACKGROUND OF THE INVENTION

1. Field of the Invention

The invention relates to a digital to time converter, and more particularly to a digital to time converter with high resolution and linearity.

2. Description of the Related Art

In the recent years, Automatic Test Equipments (ATEs) have been generally used as a measurement instrument for measuring the operation timing of Integrated Circuits (ICs). Compared with manual measurement, ATEs test ICs more efficiently and accurately. Among them, the built-in self-test (BIST) becomes the main stream of ATEs due to its low cost. A digital input front-end is the most important module of ATEs. A major component of the digital input front-end module is the Digital-to-Time Converter, or so-called Digital Pulse Generator, which generates a timing signal with a width proportional to the value of a digital control words. The timing signal is passed to the device under test (DUT) through a test channel and the measurement results are further compared to the results pre-stored in the internal memory of the ATE to determine whether the DUT is able to function properly within the predetermined timing delay and whether the output of the DUT is as expected.

However, the performance of conventional digital-to-time converters is easily affected by process, voltage and temperature (PVT) variations. Thus, the linearity of conventional digital-to-time converters is poor, and the corresponding accuracy is not satisfactory. Based on high speed and high resolution requirements, some digital-to-time converters are improved to achieve high performance conversion ate the expense of high power consumption, large chip area and high fabrication cost. Thus, a novel digital-to-time converter with low fabrication costs high resolution, high linearity, low power consumption and low sensitivity to PVT variations is needed.

BRIEF SUMMARY OF THE INVENTION

Digital to time converters and digital to time converting methods are provided. An exemplary embodiment of a digital to time converter for generating a first output signal and a second output signal separated by a predetermined delay comprises a first periodic signal generator, a second periodic signal generator, a periodic signal synchronizer, a first output pulse generator and a second output pulse generator. The first periodic signal generator generates a first periodic signal with a first period. The second periodic signal generator generates a second periodic signal with a second period. The periodic signal synchronizer is coupled to the first periodic signal generator and the second periodic signal generator and comprises a phase detector detecting the phase difference between the first periodic signal and the second periodic signal to output a phase indication signal. The first output pulse generator comprises a first counter starting a count according to the first periodic signal when the phase indication signal is asserted to indicate that the phase of the first periodic signal coincides with the phase of the second periodic signal. When a first value is counted by the first counter, the first output pulse generator outputs a pulse as the first output signal. The second output pulse generator comprises a second counter starting a count according to the second periodic signal when the phase indication signal is asserted to indicate that the phase of the first periodic signal coincides with the phase of the second periodic signal. When a second value is counted by the second counter, the second output pulse generator outputs a pulse as the second output signal. The predetermined delay relates to the first value, the second value and the timing difference between the first output signal and the second output signal.

Another exemplary embodiment of a digital to time converter for generating a first output signal and a second output signal separated by a predetermined delay comprises a first periodic signal generator, a second periodic signal generator, a first output pulse generator and a second output pulse generator. The first periodic signal generator generates a first periodic signal with a first period according to a reference signal. The second periodic signal generator generates a second periodic signal with a second period according to the reference signal. The first output pulse generator comprises a first counter starting a count according to the first periodic signal. When a first value is counted by the first counter, the first output pulse generator outputs a pulse as the first output signal. The second output pulse generator comprises a second counter starting synchronously with the first counter to count according to the second periodic signal. When a second value is counted by the second counter, the second output pulse generator outputs a pulse as the second output signal.

Another exemplary embodiment of a digital to time converter for generating a first output signal and a second output signal separated by a predetermined delay comprises a first periodic signal generator, a second periodic signal generator, a first output pulse generator and a second output pulse generator. The first periodic signal generator generates a first periodic signal with a first period according to a reference signal. The second periodic signal generator generates a second periodic signal with a second period according to the reference signal. The first output pulse generator comprises a first flip-flop comprising a clock input terminal coupled to the first periodic signal generator and outputting a pulse as the first output signal according to the first periodic signal. The second output pulse generator comprises a counter starting a count according to the second periodic signal. When a value is counted by the counter, the second output pulse generator outputs a pulse as the second output signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
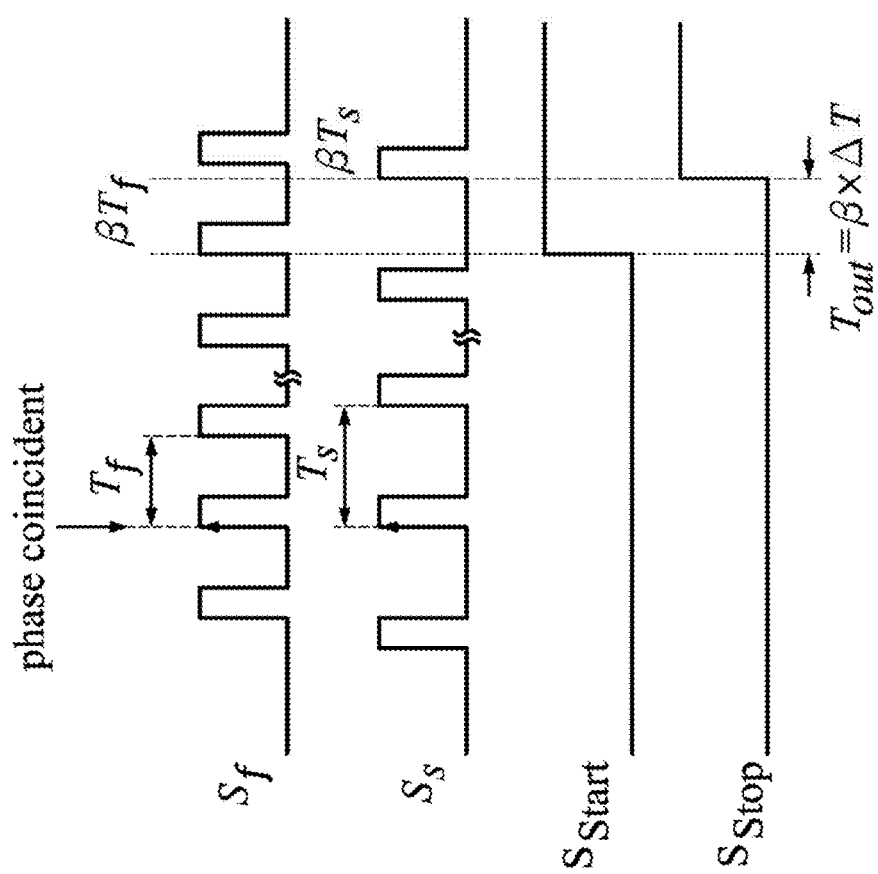
FIG. 1 illustrates the timing diagram of the corresponding signals of the digital to time converter according to an embodiment of the invention.

According to an embodiment of the invention, a vernier-like digital to time converter is provided. Based on vernier principle, two input signals $S_F$ quad $S_S$ with corresponding periods that are considerably close to each other are used as time bases, and the digital to time converter generates two output signals $S_{Start}$ and $S_{Stop}$ separated by a predetermined delay in turn according to these two input signals. To clarify the concept of the operation of the proposed digital to time converter, FIG. 1 illustrates the timing diagram of the corresponding signals of the digital to time converter according to an embodiment of the invention. As shown in FIG. 1, input signals $S_F$ and $S_S$ are respectively with different periods, wherein a period $T_S$ of the signal $S_S$ is longer than a period $T_F$ of the signal $S_F$ and the difference between the periods $T_S$ and $T_F$ is defined as $\Delta T$. According to an embodiment of the invention, when phases of the periodic signals $S_F$ and $S_S$ are coincident (as an example, when the a rising edge (or a falling edge) of the signal $S_F$ coincides with a rising edge (or a falling edge) of the signal $S_S$), the digital to time converter starts counting the number of oscillations of the periodic signals $S_F$ and $S_S$. When the signal $S_F$ has oscillated for $\beta$ times, a pulse is generated as the signal $S_{Start}$, wherein the pulse width may be flexibly designed according to different application requirements. Similarly, when the signal $S_S$ has oscillated for $\beta$ times, another pulse is generated as the signal $S_{Stop}$. Since the difference between the periods $T_S$ and $T_F$ is $\Delta T$, the time delay $T_{out}$ between the successively generated signals $S_{Start}$ and $S_{Stop}$ may be derived as:

$$T_{out}=\beta\times T_S-\beta\times T_F=\beta\times\Delta T \qquad \text{Eq. (1).}$$

Figure 3:
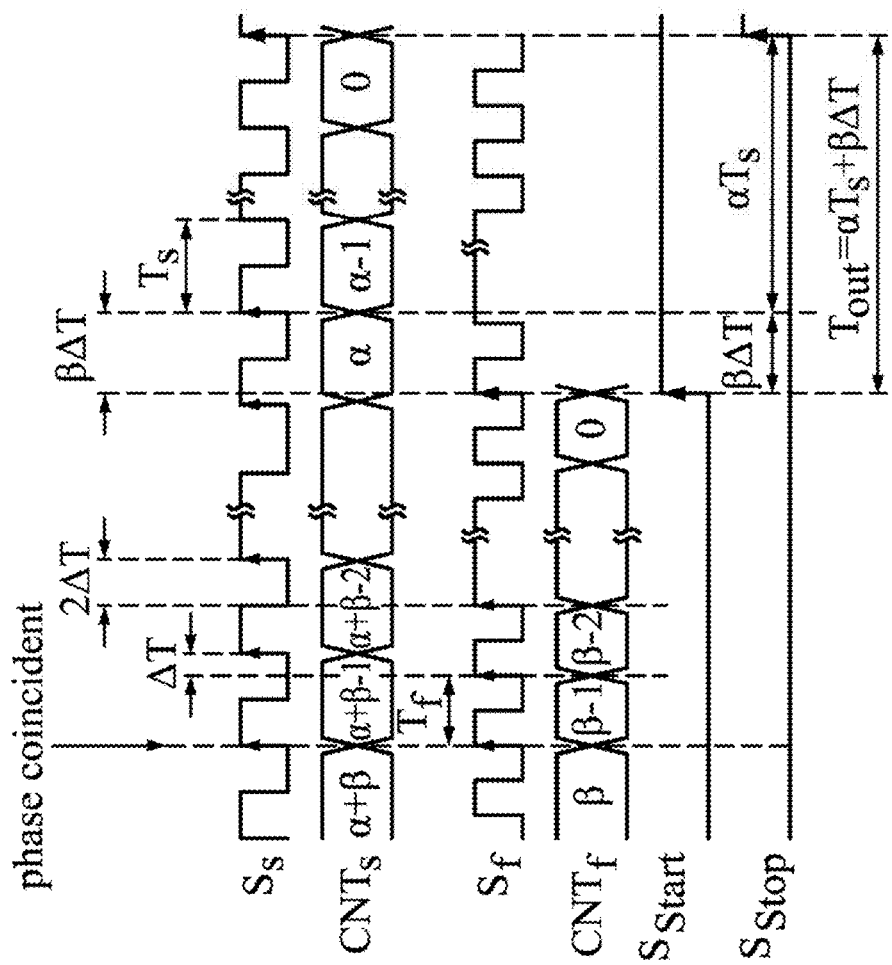
FIG. 3 illustrates the timing diagram of the corresponding signals of the digital to time converter according to an embodiment of the invention.

As shown in Eq. (1), by just using two low or medium frequency oscillation signals with periods that are close to each other, a vernier-like digital to time converter with extremely high resolution equal to the period difference $\Delta T$ can be achieved without using extremely high frequency signals. In addition, for different applications, different time delay $T_{out}$ can be obtained by just varying the counter value $\beta$. Thus, the proposed vernier-like digital to time converter can be widely used in a variety of applications. According to another embodiment of the invention, if the required time delay $T_{out}$ exceeds one period of $T_S$, as an example:

$$T_{out}=\alpha\times T_S+\beta\times\Delta T, \qquad \text{Eq. (2).}$$

the time delay $T_{out}$ may also be easily obtained by setting different counting values. As an example, when the phases of the periodic signals $S_F$ and $S_S$ are coincident, the digital to time converter starts to count the number of oscillations of the periodic signals $S_F$ and $S_S$. When the signal $S_F$ is counted to oscillate for $\beta$ times, a pulse is generated as the signal $S_{Start}$. After a short while, the signal $S_S$ will also be counted to oscillate for $\beta$ times and the time delay of $\beta\times\Delta T$ will be obtained. For obtaining the remaining time delay of $\alpha\times T_S$, after oscillating for $\beta$ times, the signal $S_S$ is allowed to continuously oscillate for $\alpha$ more times. Another pulse is then generated as the signal $S_{Stop}$ when the signal $S_S$ has completed oscillating for $(\alpha+\beta)$ times. In this way, the time delay $T_{out}$ between the successively generated signals $S_{Start}$ and $S_{Stop}$ is $\alpha\times T_S+\beta\times\Delta T$, as the one shown in Eq. (2). FIG. 3 illustrates the timing diagram of the corresponding signals and the actual time delay can be derived as below:

$$T_{out}=(\alpha+\beta)\times T_S-\beta\times T_F=\alpha\times T_S+\beta\times(T_S-T_F)=\alpha\times T_S+\beta\times\Delta T \qquad \text{Eq. (3).}$$

It may be seen from Eq. (3) that if the time $T_S$ is viewed as a coarse resolution of the digital to time converter, and the time $\Delta T$ is viewed as a fine resolution, a coarse resolution and a fine resolution can be both provided by the digital to time converter with a ratio of:

$$T_S/\Delta T=T_S/(T_S-T_F) \qquad \text{Eq. (4).}$$

Based on this concept, once the periodic signals $S_F$ and $S_S$ are precisely generated, a high resolution digital to time converter with much less sensitivity to PVT variations as compared with the conventional ones with coarse circuit and fine circuit (or so-called interpolation circuit) is achieved.

Figure 2:
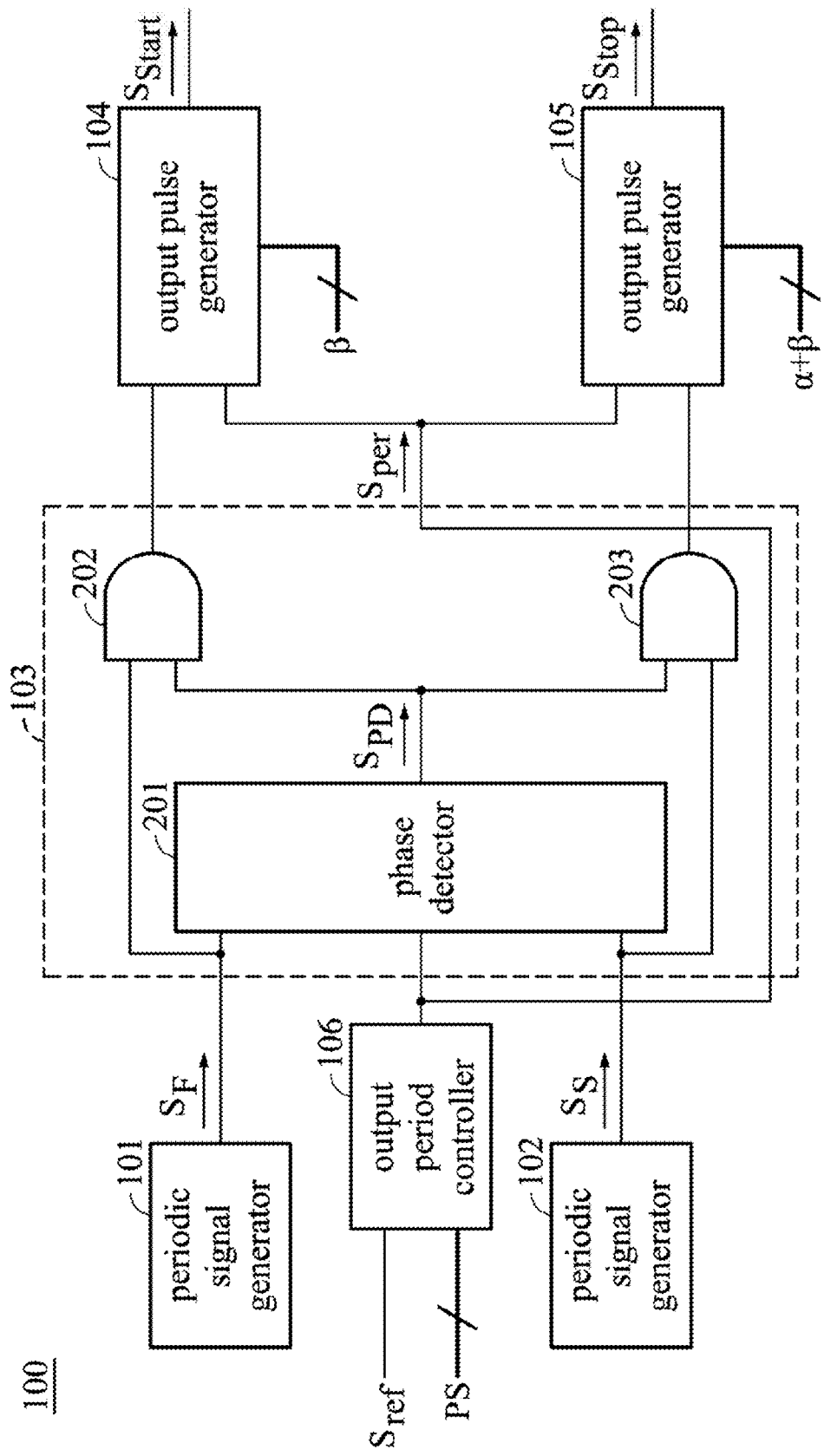
FIG. 2 is a schematic diagram showing a digital to time converter according to a first embodiment of the invention.

FIG. 2 is a schematic diagram showing a digital to time converter according to a first embodiment of the invention. The digital to time converter 100 comprises periodic signal generators 101 and 102, a periodic signal synchronizer 103 and output pulse generators 104 and 105. The periodic signal generators 101 and 102 generate a periodic signal $S_F$ with a period $T_F$ and a periodic signal $S_S$ with a period $T_S$ respectively, wherein the period $T_S$ is longer than the period $T_F$ and the difference between the periods $T_S$ and $T_F$ is $\Delta T$. According to an embodiment of the invention, the periodic signal generators 101 and 102 may be the oscillators to generate the periodic signals $S_F$ and $S_S$ with corresponding frequencies $1/T_F$ and $1/T_S$. The periodic signal synchronizer 103 is coupled to the periodic signal generators 101 and 102 and comprises a phase detector 201 detecting the phase difference between the periodic signals $S_F$ and $S_S$ and outputting a phase indication signal $S_{PD}$. Each of the output pulse generators 104 and 105 comprises a counter that receives one of the periodic signals $S_F$ and $S_S$ as the clock input, and starts to count number of oscillations of the periodic signals $S_F$ and $S_S$ when the phase indication signal $S_{PD}$ is asserted to indicate that phases of the periodic signals $S_F$ and $S_S$ are coincident. When a counted value is reached to indicate that the periodic signal $S_F$ has oscillated for $\beta$ times, the output pulse generator 104 outputs a pulse as the output signal $S_{Start}$. Similarly, when another counted value is reached to indicate that the periodic signal $S_S$ has oscillated for $(\alpha+\beta)$ times, the output pulse generator 105 outputs a pulse as the output signal $S_{Stop}$. According to an embodiment of the invention, the counters may be one kind of reloadable down counter for down counting a predetermined times. However, it is noted that the counters may also be any other kinds of counters and the invention should not be limited thereto.

According to an embodiment of the invention, the periodic signal synchronizer 103 may further comprise logic gates 202 and 203. The logic gate 202 comprises a first input terminal coupled to the periodic signal generator 101, a second input terminal coupled to the phase detector 201, and an output terminal coupled to the output pulse generator 104. The logic gate 203 comprises a first input terminal coupled to the periodic signal generator 102, a second input terminal coupled to the phase detector 201, and an output terminal coupled to the output pulse generator 105. According to an embodiment of the invention, the logic gates 202 and 203 may be an AND gate to synchronize the outputs of the periodic signals $S_F$ and $S_S$. In addition, according to an embodiment of the invention, for periodically providing the output signals $S_{Start}$ and $S_{Stop}$, the digital to time converter 100 may further comprises an output period controller 106 to generate a first control signal $S_{per}$ and a second control signal $S_{Load}$ according to a reference signal $S_{ref}$ and a period setting parameter PS (which will be described in detail in the following paragraphs) so as to control the digital to time converter 100 to periodically generate the output signals $S_{Start}$ and $S_{Stop}$ with the predetermined delay. The output pulse generators 104 and 105 periodically output the corresponding pulses as the output signals $S_{Start}$ and $S_{Stop}$ according to the first control signal $S_{per}$. As an example, according to the logic operation results and a signal level of the first control signal $S_{per}$, the output pulse generators 104 and 105 generate two pulses as the output signals $S_{Start}$ and $S_{Stop}$, respectively (will be described in detail in the following paragraphs). Furthermore, the corresponding counters in the output pulse generators 104 and 105 may restart a count (for example, the count value $\beta$ and $(\alpha+\beta)$ are reloaded to the output pulse generators 104 and 105) according to the second control signal $S_{Load}$, respectively, so as to count periodically.

FIG. 3 illustrates the timing diagram of the corresponding signals of the digital to time converter according to an embodiment of the invention, wherein the $CNT_F$ and $CNT_S$ respectively represent the counted value of the down counters clocked by the periodic signals $S_F$ and $S_S$. As shown in FIG. 3, after $CNT_F$ has counted $\beta$ $T_F$ cycles, the signal level of the output signal $S_{Start}$ is pulled high. Furthermore, after $CNT_S$ has counted $(\alpha+\beta)$ $T_S$ cycles, the signal level of the output signal $S_{Stop}$ is pulled high. In this way, the output signals $S_{Start}$ and $S_{Stop}$ can be generated according to the required time delay, and two different resolutions $T_S$ and $\Delta T$ can also be provided as shown in Eq. (3) so as to increase the digital to time converter applications.

Figure 4:
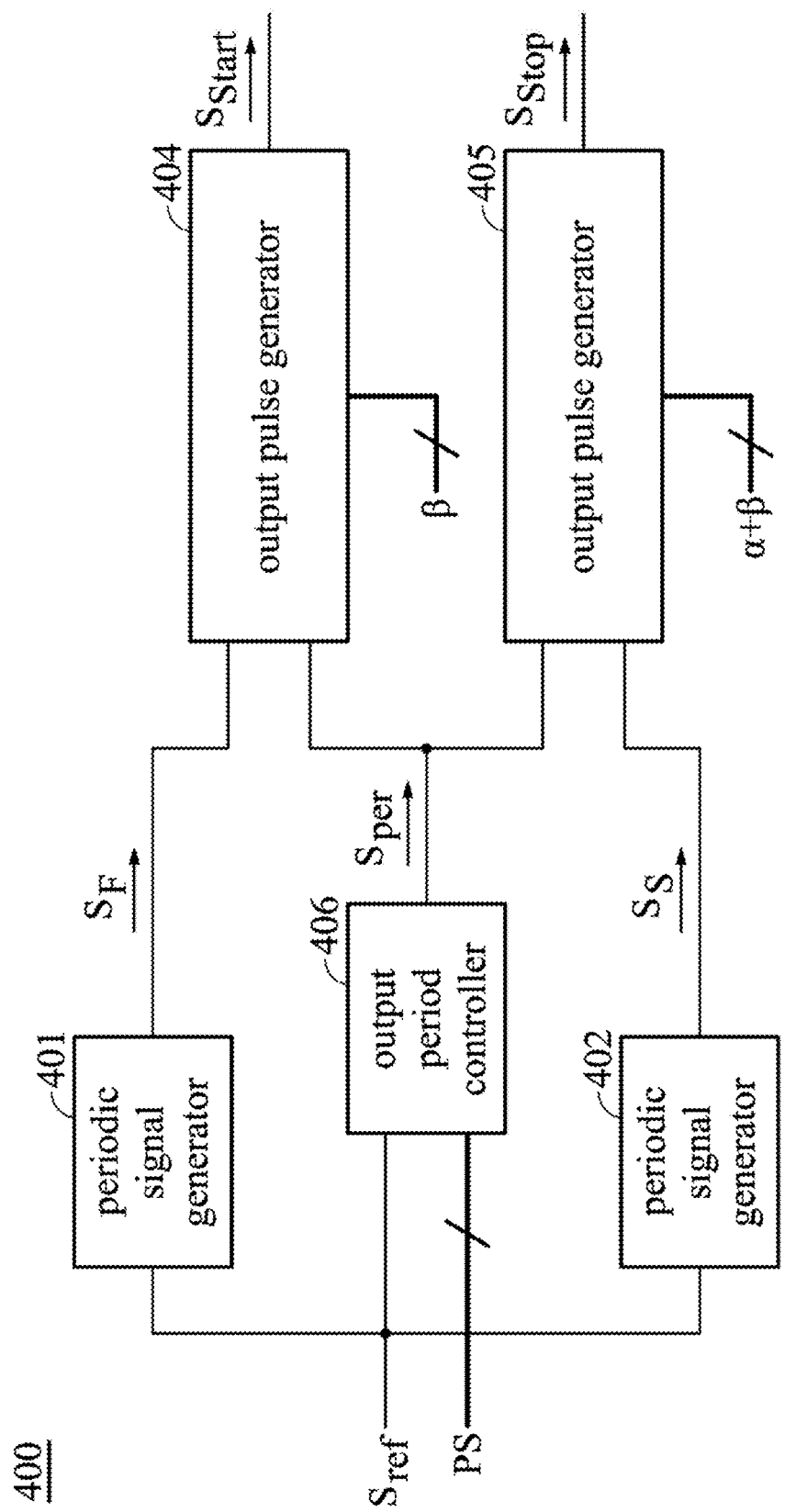
FIG. 4 illustrates a digital to time converter according to a second embodiment of the invention.

However, the phase detection error of the phase detector is unavoidable (so-called dead zone), especially when the rising edges of the signals $S_F$ and $S_S$ are very close to each other to cause metastability. Thus, in order to solve the phase detection error problem, another digital to time converter, that may not only precisely generate the periodic signals $S_F$ and $S_S$ but also accurately detect the phase coincidence of the periodic signals $S_F$ and $S_S$, is provided according to a second embodiment of the invention. FIG. 4 illustrates a digital to time converter according to a second embodiment of the invention. The digital to time converter 400 comprises periodic signal generators 401 and 402, an output period controller 406 and output pulse generators 404 and 405. The periodic signal generators 401 and 402 generate a periodic signal $S_F$ with a period $T_F$ and a periodic signal $S_S$ with a period $T_S$, respectively, wherein the period $T_S$ is longer than the period $T_F$ and the difference between the periods $T_S$ and $T_F$ is $\Delta T$. According to an embodiment of the invention, the periodic signal generators 401 and 402 may be Phase-Locked Loops (PLLs) to generate the periodic signals $S_F$ and $S_S$ each with a corresponding frequency $1/T_F$ and $1/T_S$ according to a reference signal $S_{ref}$.

Figure 5:
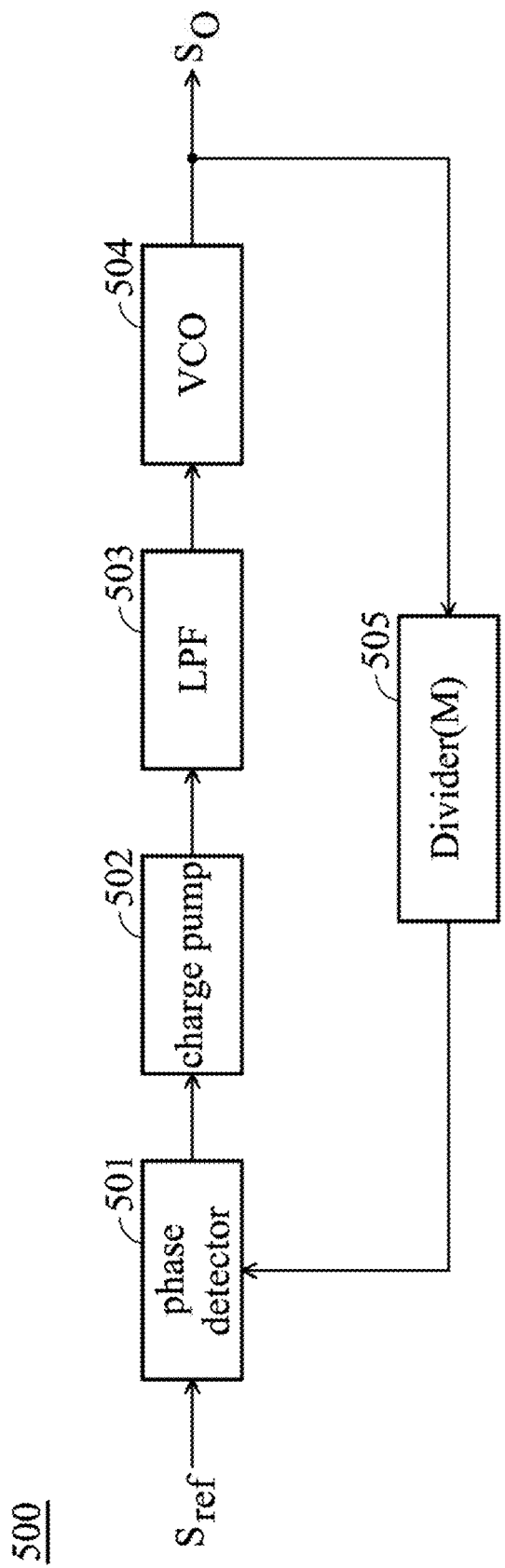
FIG. 5 illustrates a schematic diagram of a phase-locked loop according to the second embodiment of the invention.

FIG. 5 illustrates a schematic diagram of a typical phase-locked loop according to the second embodiment of the invention. The phase-locked loop 500 comprises a phase detector 501, a charge pump 502, a low pass filter (LPF) 503, a voltage controlled oscillator (VCO) 504 and a divider (or called a prescaler) 505. Assumes a divisor of the divider is M, then the relationship between the frequencies of an output signal $S_o$ and the reference signal $S_{ref}$ is derived as:

$$f_o = M f_{ref} \qquad \text{Eq. (5),}$$

and the period may be expressed as:

$$T_o = \frac{T_{ref}}{M}. \qquad \text{Eq. (6)}$$

Eq. (6) shows that the period $T_{ref}$ of the reference signal $S_{ref}$ is a multiple of the period $T_o$ of the output signal $S_o$. Thus, after oscillating for M times, a rising edge of the output signal $S_o$ naturally and perfectly coincides with a rising edge of the reference signal $S_{ref}$.

Based on the concept, and referring back to FIG. 4, when two PLLs are used as the periodic signal generators 401 and 402 and the output signals of the VCOs of the PLLs are further used as the outputted periodic signals $S_F$ and $S_S$, the rising edges of the reference signal $S_{ref}$ naturally coincide with the rising edges of the periodic signals $S_F$ and $S_S$. In this way, the periodic signal synchronizer as shown in FIG. 2 may be eliminated from the digital to time converter. In addition, if the divisors M and N of the dividers in two PLLs are set to values which are very close to each other, the effective fine resolution of the digital to time converter 400 may be derived as:

$$\Delta T = \frac{T_{ref}}{M} - \frac{T_{ref}}{N}, M < N. \qquad \text{Eq. (7)}$$

For example, when M=255 and N=256. Eq. (7) becomes $$\Delta T = \frac{T_{ref}}{255} - \frac{T_{ref}}{256} = \frac{T_{ref}}{65280}. \qquad \text{Eq. (8)}$$

Eq. (8) shows that an extremely high resolution may still be achieved even if the frequency of the reference signal $S_{ref}$ is not so high.

Figure 6:
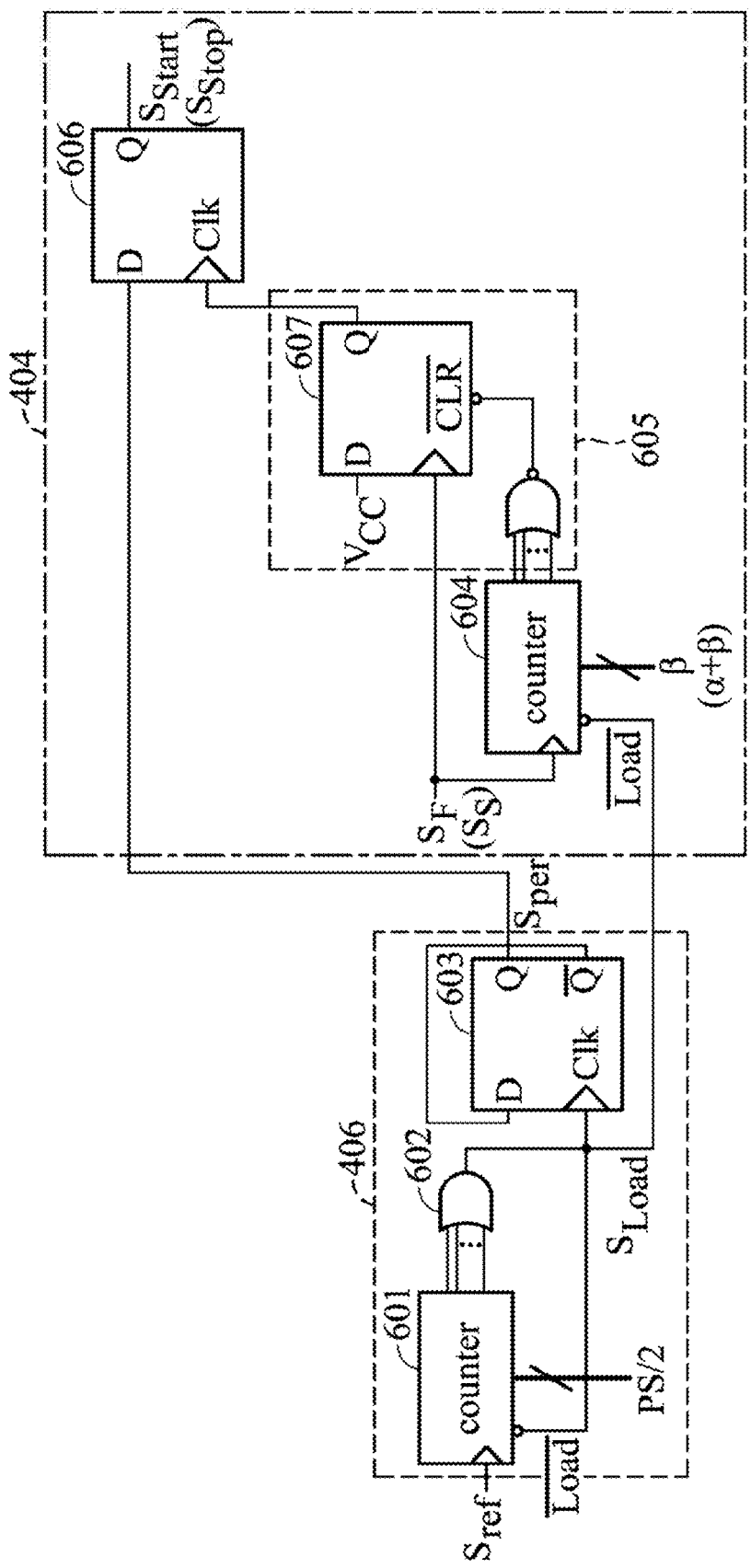
FIG. 6 illustrates a circuit diagram of the output period controller and the output pulse generator according to an embodiment of the invention.
Figure 7:
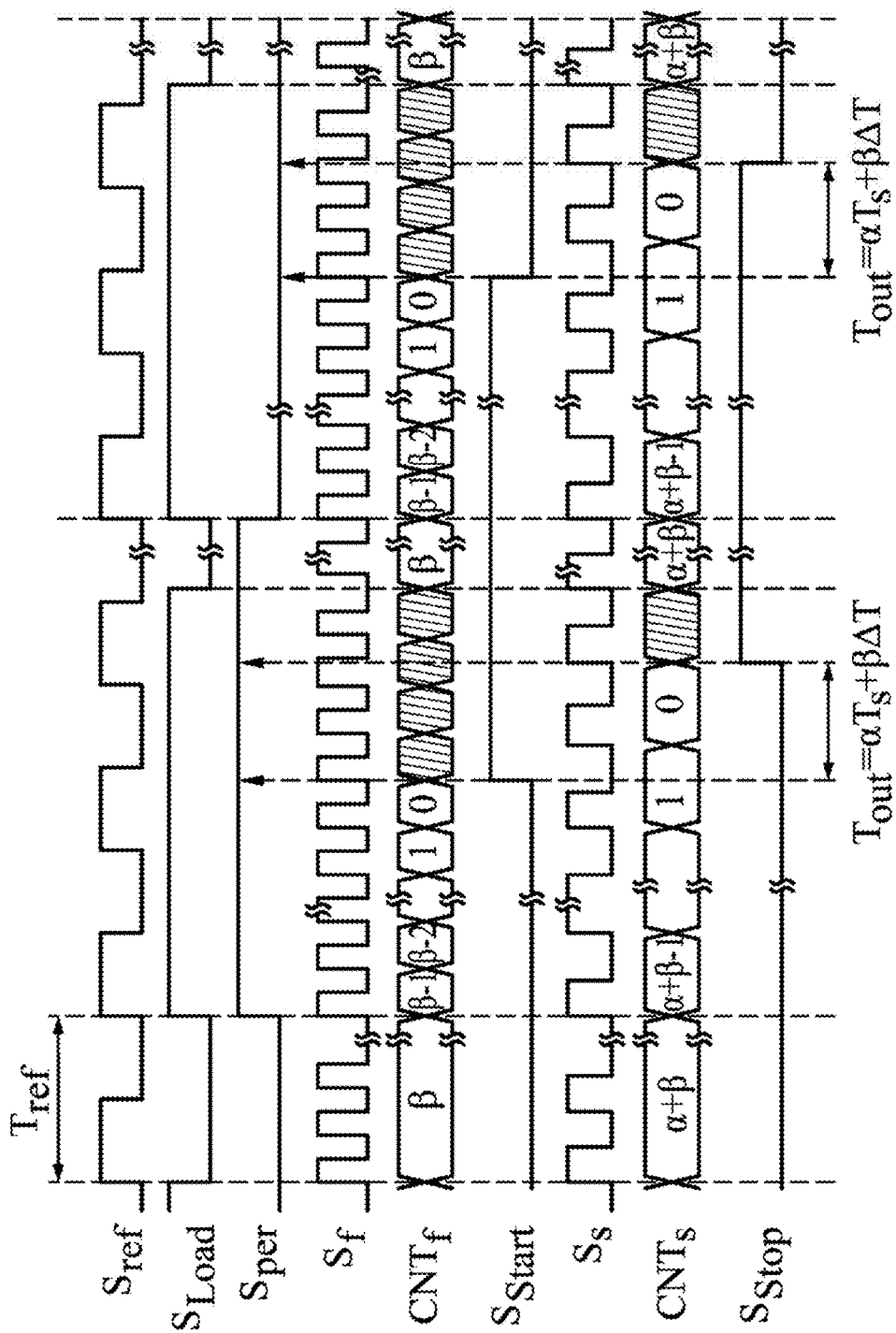
FIG. 7 illustrates the timing diagram of the corresponding signals of the digital to time converter according to an embodiment of the invention.

FIG. 6 illustrates a circuit diagram of the output period controller and the output pulse generator according to an embodiment of the invention. It should be noted that any of the output period controllers and the output pulse generators illustrated here, including the output period controller 106, 406, 806 and/or 906 and the output pulse generator 104, 105, 404, 405, 804, 805 and/or 905 may be implemented as shown in FIG. 6. As shown in FIG. 6, the output period controller 406 comprises a counter 601, a logic gate 602 and a flip-flop 603, and the output pulse generator 404 comprises a counter 604, a logic circuit module 605 and a flip-flop 606. FIG. 7 further illustrates the timing diagram of the corresponding signals of the digital to time converter according to an embodiment of the invention. Reference may be made to both FIG. 6 and FIG. 7 for better understanding.

When the reference signal $S_{ref}$ is inputted to the output period controller 406, it is frequency divided so as to generate a control signal $S_{per}$ for controlling the output period. The control signal $S_{per}$ is used to control the periods of the output signals $S_{Start}$ and $S_{Stop}$. As an example, the period of the control signal $S_{per}$ may be designed equal to the required periods of the signals $S_{Start}$ and $S_{Stop}$. The frequency division may be implemented by the counter 601, the logic gate 602 and the flip-flop 603, wherein the counter 601 may be a reloadable down counter with a counting value set to PS/2. The PS is the period setting parameter that may be flexibly designed according to different requirements for the period of the output signals $S_{Start}$ and $S_{Stop}$. The logic gate 602 may be an OR gate to perform an logic OR operation according to the counted results of the counter 601 so as to detect the required period when the counted value reaches zero. The operation result of the logic gate 602 is output as the control signal $S_{Load}$, and the counter 601 is restarted according to a signal level of the control signal $S_{Load}$ (as an example, the value PS/2 is reloaded according to a low level of the signal $\overline{Load}$). The flip-flop 603 may be a D flip-flop (DFF) with a complementary output terminal ($\overline{Q}$) coupled to an input terminal (D), and a clock input terminal (clk) coupled to the output terminal of the logic gate 602 so as to be triggered according to the signal level of the control signal $S_{Load}$ (as an example, a high signal level or a low signal level) for outputting the control signal $S_{per}$. The control signal $S_{per}$ with a 50% duty cycle may be generated through the flip-flop 603 triggered by the control signal $S_{Load}$, and the periods of the output signals $S_{Start}$ and $S_{Stop}$ are further controlled by the control signal $S_{per}$ to be PS times of the period $T_{ref}$ of the reference signal.

In addition, the control signal $S_{Load}$ is not only used to reload the counter (for example, counter 601) inside of the output period controller, but also used to reload the counter (for example, counter 604) inside of the output pulse generators. Because the frequency of the control signal $S_{Load}$ is two times of the frequency of the control signal $S_{per}$, the signal level of the control signal $S_{Load}$ is always low before every rising or falling edges of the control signal $S_{per}$. Thus, the counters inside of the two output pulse generators may be reloaded with the predetermined counting values of β and (α+β) right before the transitions (e.g. from high to low or from low to high) of the control signal $S_{per}$ according to the signal level of the control signal $S_{Load}$, respectively. The counters then starts to count down the number of oscillation cycles of the periodic signal $S_F$ and $S_S$. As shown in FIG. 6, when the counted value reaches zero, the next rising edge of the periodic signal $S_F$ ($S_S$) is latched and then output by the flip-flop 607 in the logic circuit module 605 as the output signal $S_{Start}$ ($S_{Stop}$). Thus, the output signals $S_{Start}$ and $S_{Stop}$ may be regarded as a delayed version of the control signal $S_{per}$ by $βT_F$ and $(α+β) T_S$, respectively. In this way, the predetermined time delay $T_{out}$ separated between the output signals $S_{Start}$ and $S_{Stop}$ would be $α×T_S+β×ΔT$. Furthermore, since the duty cycle of the control signal $S_{per}$ is 50%, the duty cycles of the delayed versions $S_{Start}$ and $S_{Stop}$ are also 50%.

Figure 8:
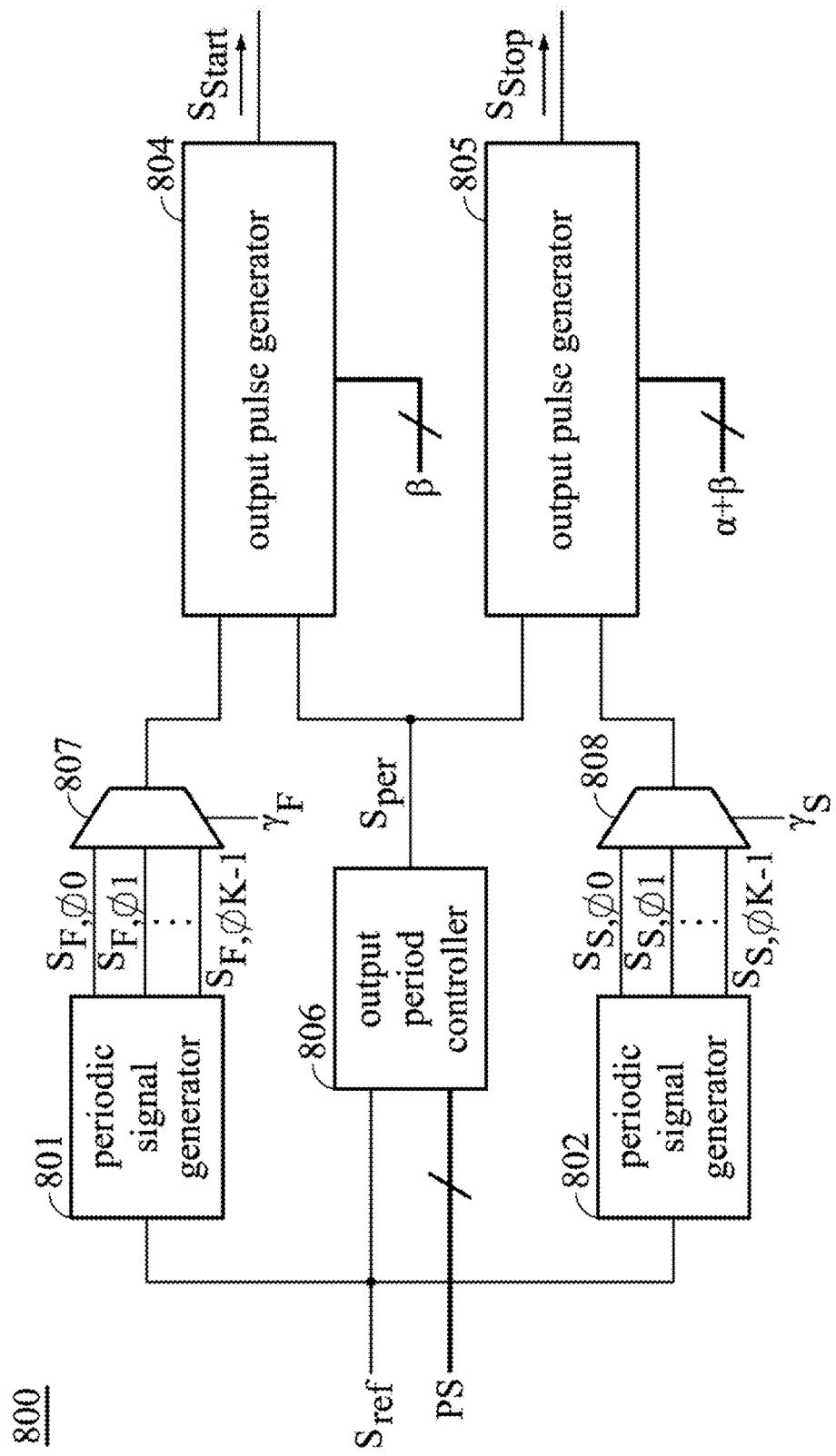
FIG. 8 illustrates a digital to time converter according to a third embodiment of the invention.

According to a third embodiment of the invention, the signals output by the VCO (such as the VCO 504 shown in FIG. 5) with different phases may be used to further enhance the resolution of the digital to time converter. FIG. 8 illustrates a digital to time converter according to a third embodiment of the invention. The digital to time converter 800 comprises periodic signal generators 801 and 802, multiplexers 807 and 808, output period controller 806 and output pulse generators 804 and 805. According to an embodiment of the invention, the periodic signal generators 801 and 802 may be the PLLs to generate the periodic signals $S_F$ and $S_S$ each with a corresponding frequency $1/T_F$ and $1/T_S$ according to a reference signal $S_{ref}$. Reference may be made to FIG. 6 for the detailed circuit and operations of the output period controller 806 and the output pulse generators 804 and 805, and the corresponding descriptions of the output period controller 806 and the output pulse generators 804 and 805 are omitted here for brevity.

Figure 9:
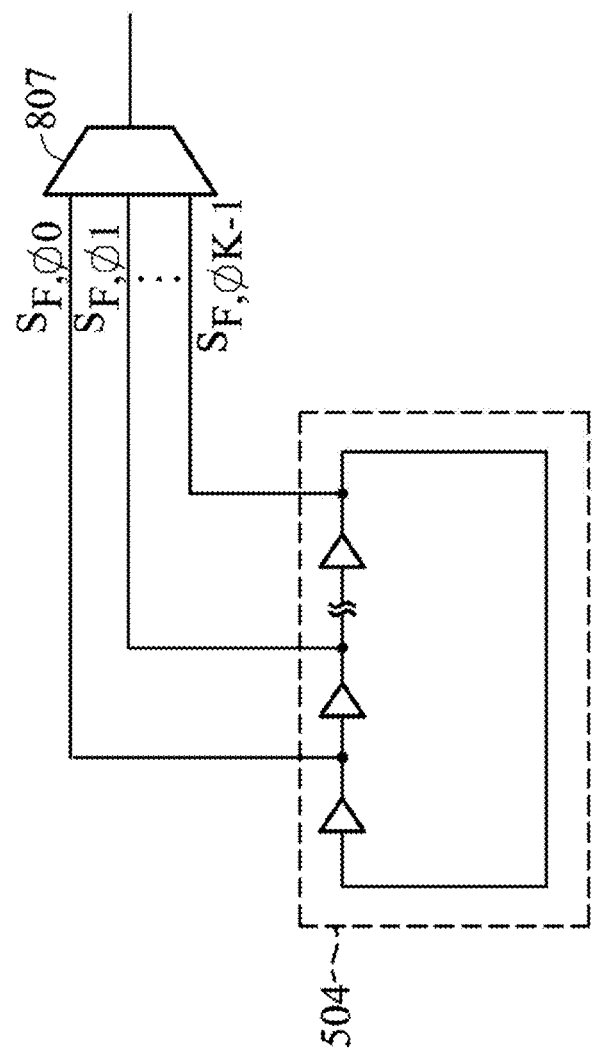
FIG. 9 is a circuit diagram illustrating how the multiplexer coupled to the VCO of the PLL according to the third embodiment of the invention.

FIG. 9 is a circuit diagram illustrating the coupling between the VCO of the PLL and the multiplexer according to the third embodiment of the invention. As shown in FIG. 9, the VCO 504 may comprise a series of delay units for generating a plurality of oscillation signals $S_{F,\Phi_0} \sim S_{F,\Phi_{K-1}}$ with different phases according to a predetermined phase offset. Thus, the PLL may further provide K oscillation signals with K different phases. Referring back to FIG. 8, if both of the periodic signal generators 801 and 802 generate signals with K different phases, the phase difference between the two output periodic signals may be 1/K times of ΔT. In this way, a finest resolution may be obtained as:

$$\Delta P = \frac{\Delta T}{K} = \frac{\left(\frac{T_{ref}}{M} - \frac{T_{ref}}{N}\right)}{K}. \qquad \text{Eq. (9)}$$

Thus, by using one more set of switches or a multiplexer coupled to the VCO as shown in FIG. 9 for selecting a specific output phase, the predetermined time delay $T_{out}$ becomes:

$$T_{out}=(\alpha+\beta)\times T_S-\beta\times T_F+\gamma_S\times\Delta P_S-\gamma_F\times\Delta P_F, \qquad \text{Eq. (10)}$$

wherein $\gamma_F$ represents a selection value for controlling the switches or the multiplexer 807 (as an example, the $\gamma_F$-th phase of the VCO is selected and output via the multiplexer 807 according to the selection value $\gamma_F$). $\gamma_S$ represents a selection value for controlling the switches or the multiplexer 808, $\Delta P_F$ represents the phase offset provided by the periodic signal generator 801 and $\Delta P_S$ represents the phase offset provided by the periodic signal generator 802. The phase offsets $\Delta P_F$ and $\Delta P_S$ may further be derived as:

$$\Delta P_F = \frac{T_F}{K} = \frac{T_{ref}}{N\times K}, \qquad \text{Eq. (11)}$$

$$\Delta P_S = \frac{T_S}{K} = \frac{T_{ref}}{M\times K}. \qquad \text{Eq. (12)}$$

Figure 10:
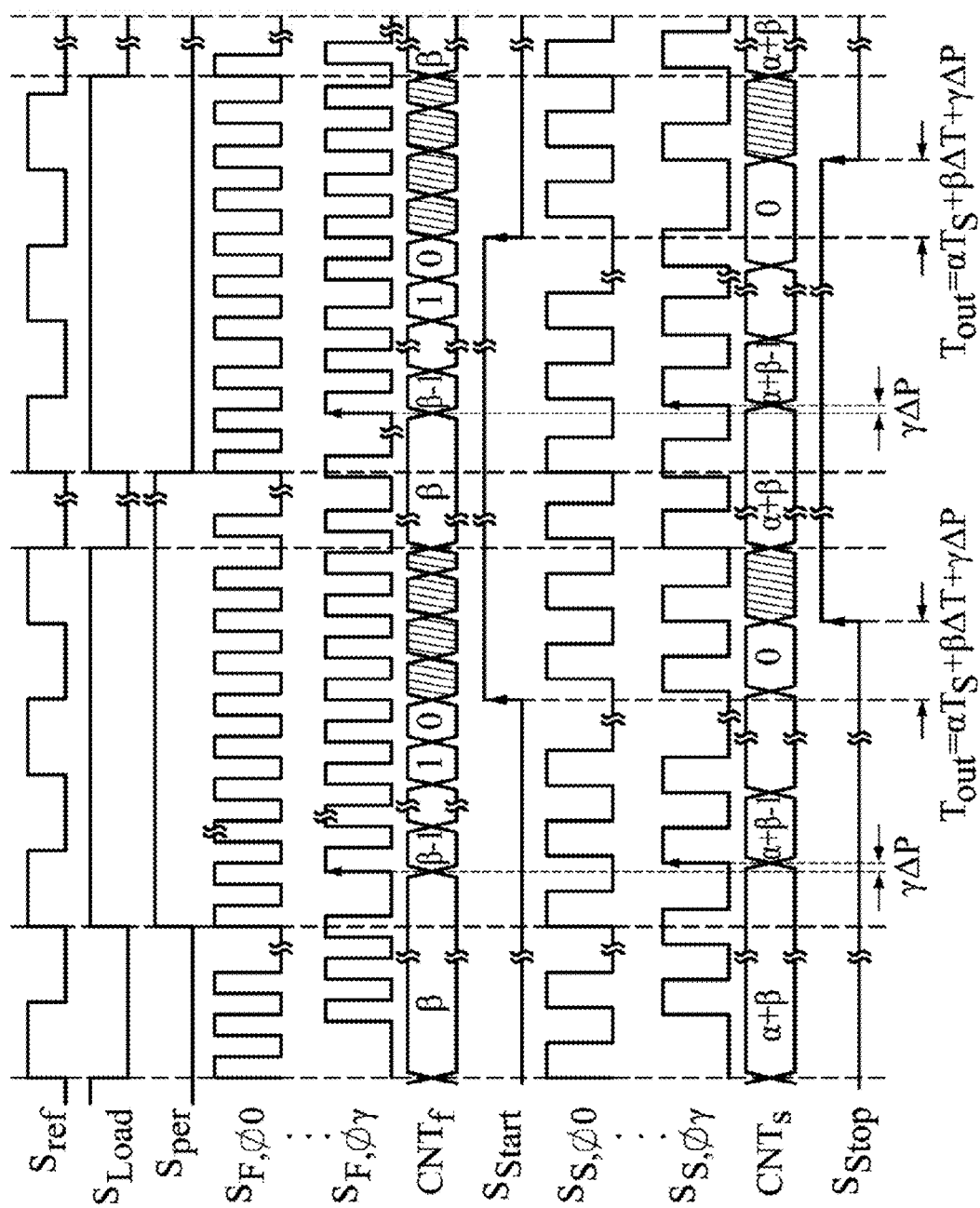
FIG. 10 illustrates the timing diagram of the corresponding signals of the digital to time converter according to an embodiment of the invention.

FIG. 10 illustrates the timing diagram of the corresponding signals of the digital to time converter according to an embodiment of the invention. According to the embodiment of the invention, both selection values of the multiplexer 807 and 808 are set to γ. Thus, the predetermined time delay between the output signals $S_{Start}$ and $S_{Stop}$ may be derived as:

$$T_{out}=\alpha\times T_S+\beta\times\Delta T+\gamma\times(\Delta P_S-\Delta P_F)=\alpha\times T_S+\beta\times\Delta T+\gamma\times\Delta P \qquad \text{Eq. (13)}$$

Figure 11:
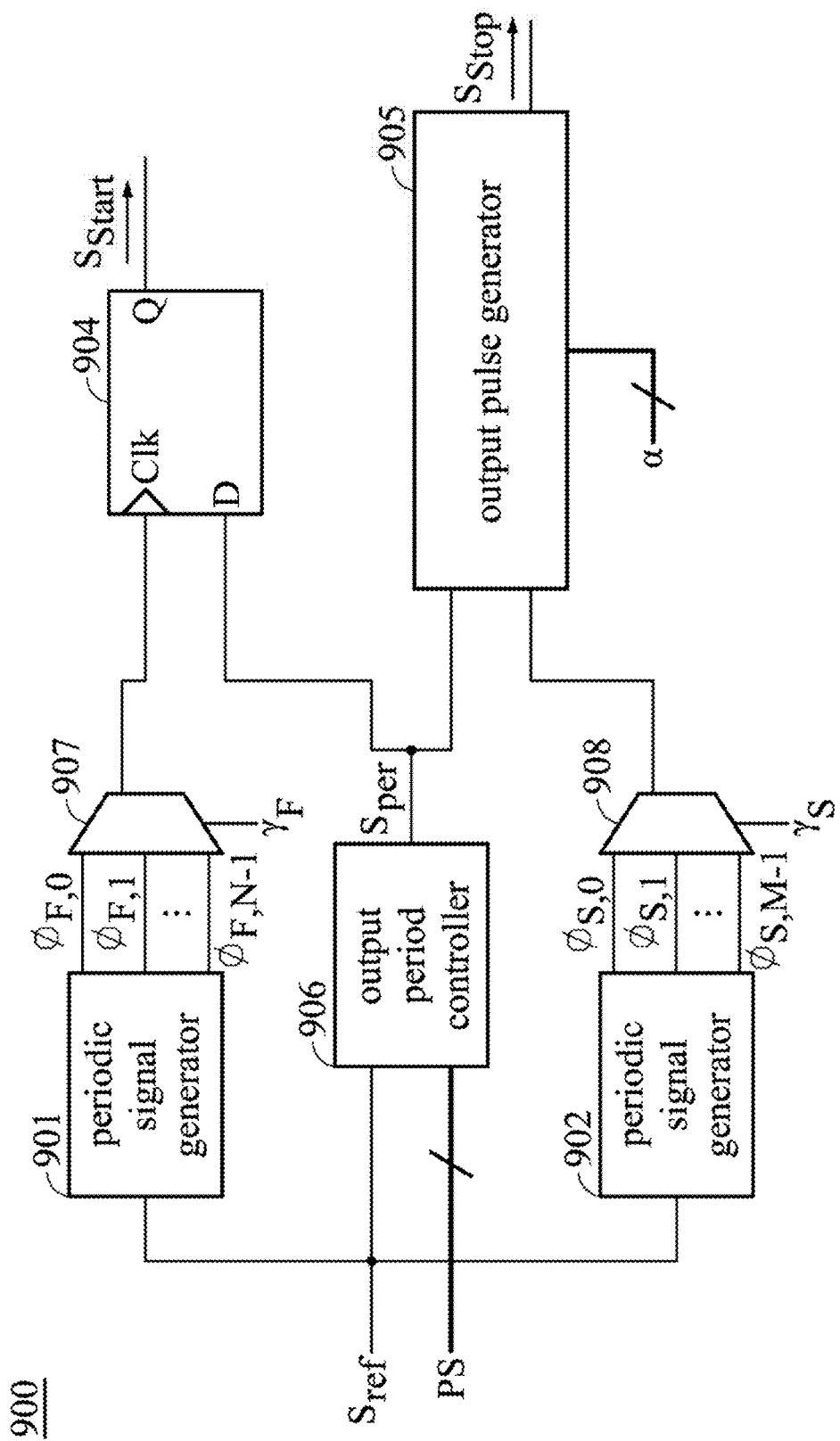
FIG. 11 illustrates a digital to time converter according to the fourth embodiment of the invention.

FIG. 11 illustrates a digital to time converter according to the fourth embodiment of the invention. The digital to time converter 900 comprises periodic signal generators 901 and 902, multiplexers 907 and 908, an output period controller 906 and output pulse generators 904 and 905. According to the embodiment of the invention, the output pulse generator 904 may be a flip-flop, such as a DFF. Reference may be made to FIG. 6 for the detailed circuitry and operations of the output period controller 906 and the output pulse generator 905, thus corresponding descriptions are omitted here for brevity.

Figure 12:
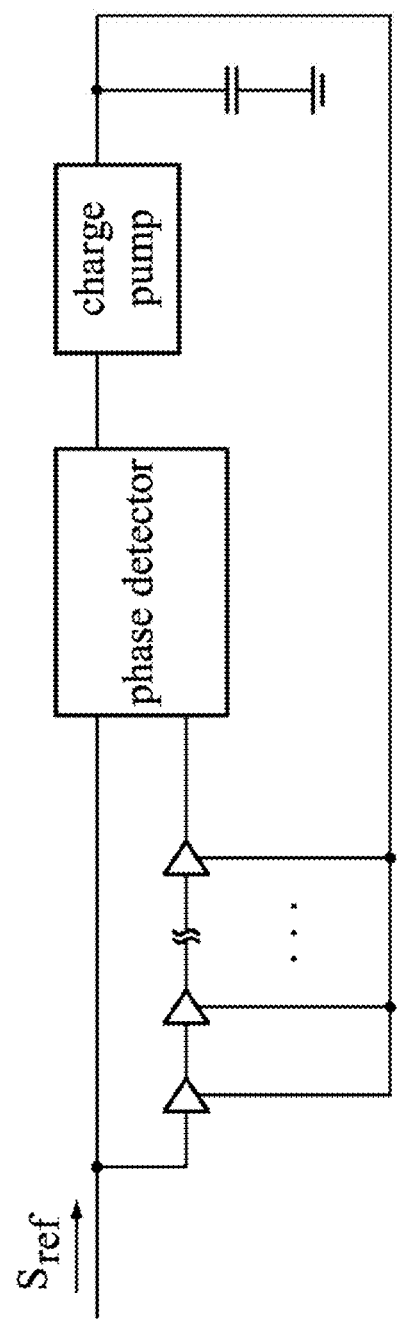
FIG. 12 illustrates a schematic diagram of a delay-locked loop according to the second embodiment of the invention.

According to the embodiment of the invention, the periodic signal generators 901 and 902 may be the phase-locked loops (PLLs) or delay-locked loops (DLLs). When the periodic signal generators 901 and 902 are the PLLs, the divisor of the divider may be set to 1. Thus, the periodic signal generators 901 and 902 generate periodic signals $S_F$ and $S_S$ according to a reference signal $S_{ref}$, and the corresponding frequencies of the signals $S_F$ and $S_S$ are equal to the frequency of the reference signal $S_{ref}$. Referring to FIG. 9, the $\gamma_F$-th output of the oscillation signals $\phi_{F,0}, \phi_{F,1}, \ldots, \phi_{F,N-1}$ and $\gamma_S$-th output of the oscillation signals $\phi_{S,0}, \phi_{S,1}, \ldots, \phi_{S,M-1}$ that are respectively generated by the two VCOs may be selected by the switches or multiplexers 907 and 908 to be the input periodic signals for output pulse generators 904 and 905. Similarly, when the periodic signal generators 901 and 902 are the DLLs, since the DLL also comprises a series of delay units as shown in FIG. 12, one phase of the oscillation signals $\phi_{F,0}, \phi_{F,1}, \ldots, \phi_{F,N-1}$ and one phase of the oscillation signals $\phi_{S,0}, \phi_{S,1}, \ldots, \phi_{S,M-1}$ that are respectively outputted by the delay unit may also be selected by the switches or multiplexers 907 and 908 according to the selection values $\gamma_F$ and $\gamma_S$ to be the input periodic signals for output pulse generators 904 and 905.

In the embodiment, since the period of the reference signal $S_{ref}$ is subdivided into M and N phases by PLLs or DLLs, the fine resolution may still be obtained as:

$$\Delta P = \Delta P_S - \Delta P_F = \left(\frac{T_{ref}}{M} - \frac{T_{ref}}{N}\right), \quad \text{Eq. (14)}$$

where $\Delta P_S = \frac{T_{ref}}{M}$, $\Delta P_F = \frac{T_{ref}}{N}$ and $M < N$.

Figure 13:
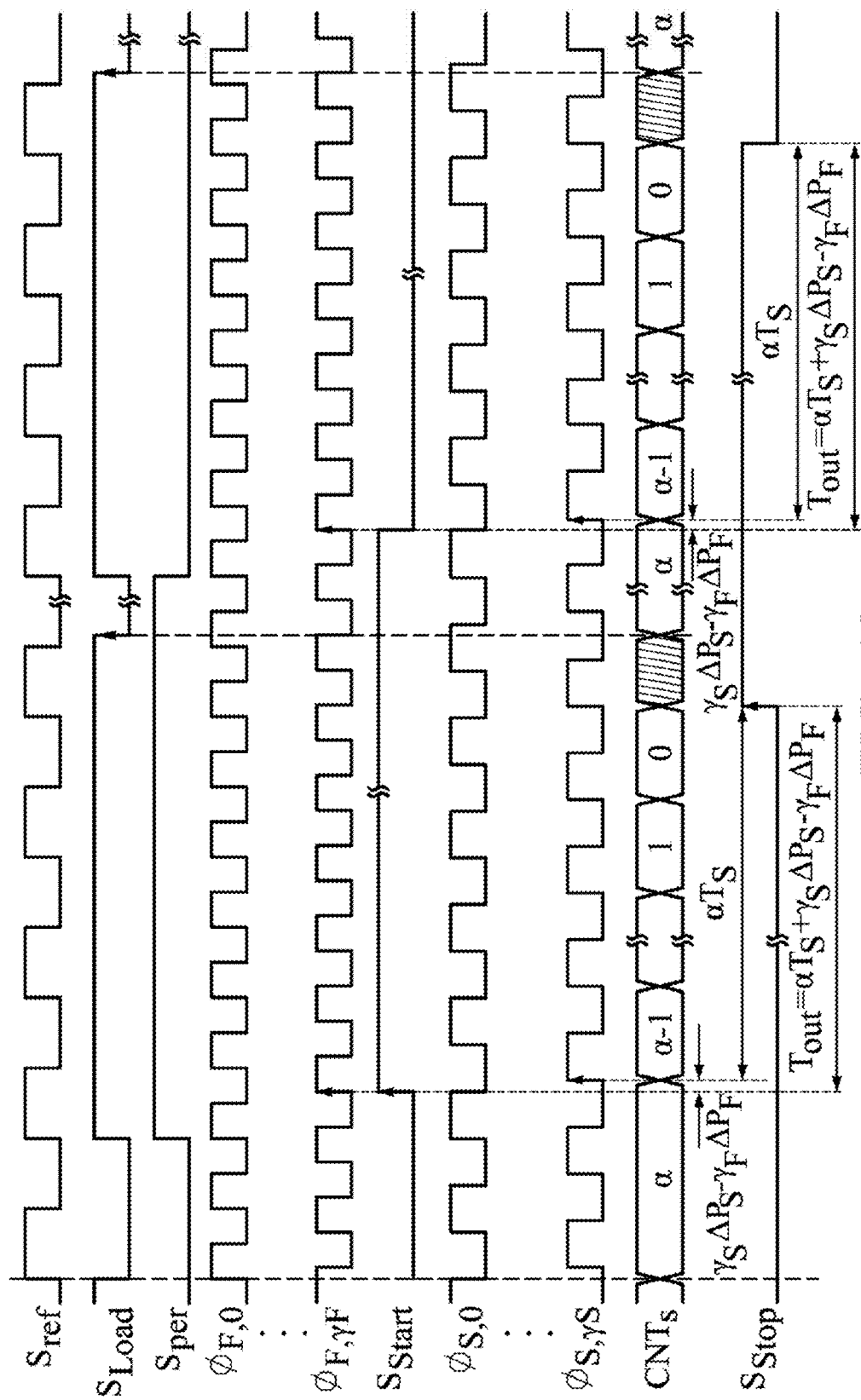
FIG. 13 illustrates the timing diagram of the corresponding signals of the digital to time converter according to an embodiment of the invention.

Thus, the required time delay such as $\gamma \times \Delta P$ may be easily obtained by selecting the $\gamma$-th phase generated by the PLLs or DLLs via the multiplexers or the switches and outputting the selected signals to the output pulse generators. In addition, the coarse resolution may also be obtained by further counting for $\alpha$ oscillation cycles as shown in FIG. 8. FIG. 13 illustrates the timing diagram of the corresponding signals of the digital to time converter according to an embodiment of the invention. As shown in FIG. 13, the predetermined time delay $T_{out}$ separated between the periodic signals $S_{Start}$ and $S_{Stop}$ is set as:

$$T_{out} = \alpha T_S + \gamma_S \Delta P_S - \gamma_F \Delta P_F \quad \text{Eq. (15).}$$

In this manner, both coarse and fine resolutions may be realized.

Figure 14:
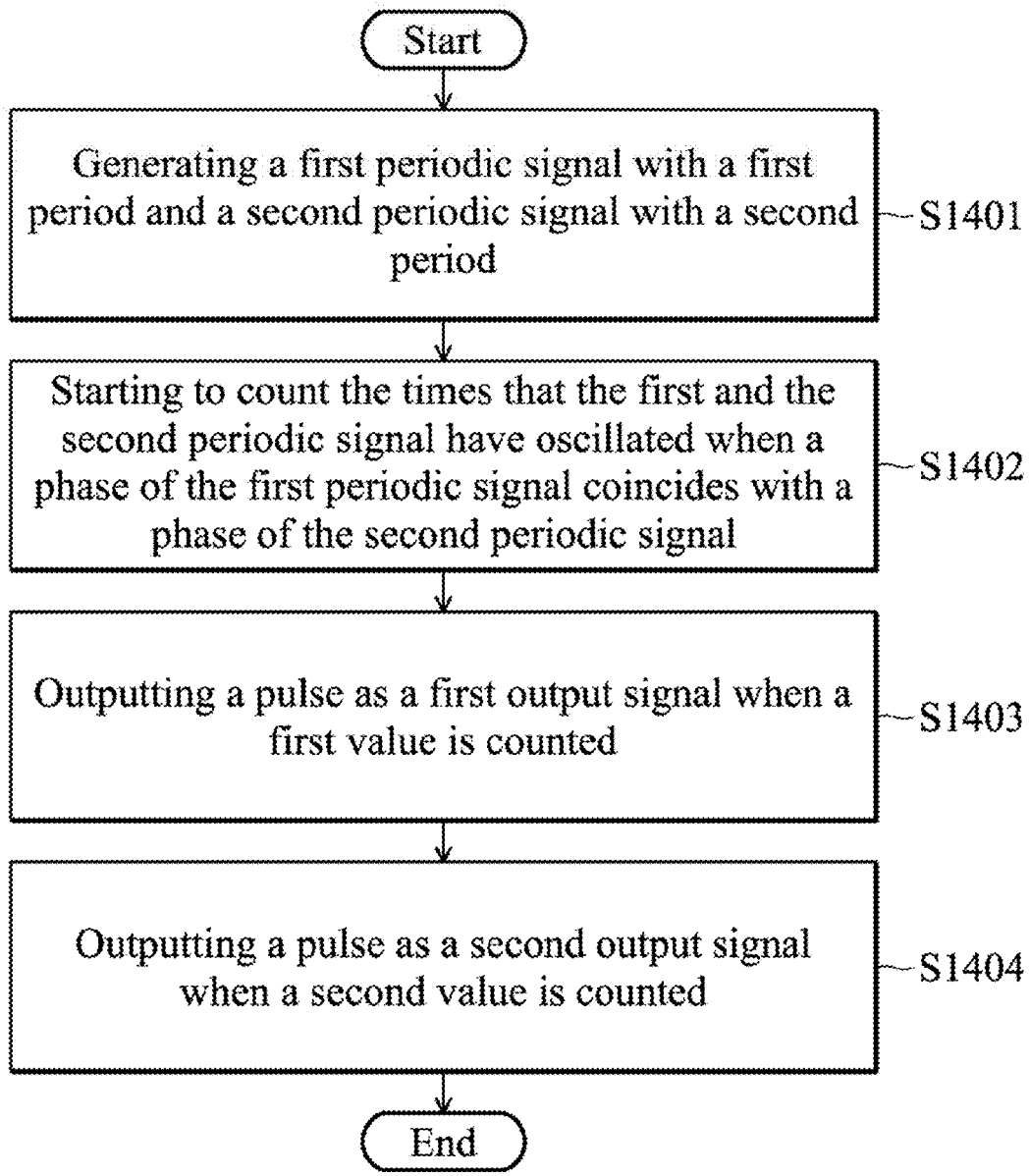
FIG. 14 is a flow chart illustrating a digital to time converting method according to an embodiment of the invention.

FIG. 14 is a flow chart illustrating a digital to time converting method according to an embodiment of the invention. To start, a first periodic signal with a first period and a second periodic signal with a second period are generated (step S1401). Next, the times (cycles) that the first and the second periodic signal have oscillated are counted when a phase of the first periodic signal coincides with a phase of the second periodic signal (step S1402). Next, a pulse is outputted as a first output signal when a first value is counted, which represents that the first periodic signal has oscillated a first number of times (step S1403). Finally, a pulse is outputted as a second output signal when a second value is counted, which represents that the second periodic signal has oscillated a second number of times (step S1404). The predetermined delay relates to the first number, the second number, the first period and the second period, and the first periodic signal and the second periodic signal are generated according to a reference signal. The reference signal and a period setting parameter are further used to generate a first control signal and a second control signal. A period of the first control signal and a period of the second control signal are both a multiple of a period of the reference signal and the period setting parameter. According to an embodiment of the invention, the counters clocked by the first periodic signal and the second periodic signal starts to count synchronously when phases of the first periodic signal and the second periodic signal are determined to coincide with each other according to the signal levels of the reference signal, the first control signal or the second control signal.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A digital to time converter for generating a first output signal and a second output signal separated by a predetermined delay, comprising:
   a first periodic signal generator generating a first periodic signal with a first period;
   a second periodic signal generator generating a second periodic signal with a second period;
   a periodic signal synchronizer coupled to the first periodic signal generator and the second periodic signal generator and comprising:
      a phase detector detecting a phase difference between the first periodic signal and the second periodic signal, and outputting a phase indication signal;
   a first output pulse generator, comprising:
      a first counter starting a count according to the first periodic signal when the phase indication signal is asserted to indicate that a phase of the first periodic signal coincides with a phase of the second periodic signal, wherein when a first value is counted, the first output pulse generator outputs a pulse as the first output signal; and
   a second output pulse generator, comprising:
      a second counter starting a count according to the second periodic signal when the phase indication signal is asserted to indicate that a phase of the first periodic signal coincides with a phase of the second periodic signal, wherein when a second value is counted, the second output pulse generator outputs a pulse as the second output signal,
   wherein the predetermined delay relates to the first value, the second value and a difference between the first period and the second period.

2. The digital to time converter as claimed in claim 1, wherein a relationship between the predetermined delay, the first value, the second value, the first period and the second period is expressed as:

$$T_{out} = (\alpha + \beta) \times T_S - \beta \times T_F,$$

wherein $T_{out}$ represents the predetermined delay, $\beta$ represents the first value, $(\alpha + \beta)$ represents the second value, $T_F$ represents the first period and $T_S$ represents the second period.

3. A digital to time converter for generating a first output signal and a second output signal separated by a predetermined delay, comprising:
- a first periodic signal generator generating a first periodic signal with a first period according to a reference signal;
- a second periodic signal generator generating a second periodic signal with a second period according to the reference signal;
- a first output pulse generator, comprising:
  - a first counter starting a count according to the first periodic signal, wherein when a first value is counted, the first output pulse generator outputs a pulse as the first output signal; and
- a second output pulse generator, comprising:
  - a second counter starting synchronously with the first counter to count according to the second periodic signal, wherein when a second value is counted, the second output pulse generator outputs a pulse as the second output signal,
- wherein a period of the reference signal is a multiple of the first period and the second period, and wherein the predetermined delay relates to the first value, the second value and a difference between the first period and the second period.

4. The digital to time converter as claimed in claim 3, wherein a relationship between the predetermined delay, the first value, the second value, the first period and the second period is expressed as:

$$T_{out} = (\alpha+\beta) \times T_S - \beta \times T_F,$$

wherein $T_{out}$ represents the predetermined delay, $\beta$ represents the first value, $(\alpha+\beta)$ represents the second value, $T_F$ represents the first period and $T_S$ represents the second period.

5. The digital to time converter as claimed in claim 3, wherein the first periodic signal generator and the second periodic signal generator are phase-locked loops (PLLs), respectively, the reference signal is a reference signal of the phase-locked loops, each phase-locked loop comprises a controlled oscillator, and wherein the first periodic signal and the second periodic signal are the output signals of the controlled oscillators, respectively.

6. The digital to time converter as claimed in claim 3, further comprising:
- an output period controller coupled to the first output pulse generator and the second output pulse generator for outputting a first control signal and a second control signal according to the reference signal and a period setting parameter, wherein a period of the first control signal and a period of the second control signal are both a multiple of a period of the reference signal and a period setting parameter.

7. The digital to time converter as claimed in claim 6, wherein the first output pulse generator and the second output pulse generator periodically output the corresponding pulses as the first output signal and the second output signal according to the first control signal, and the period of the first control signal is two times as long as the period of the second control signal, and wherein the first counter and the second counter restart a count according to the second control signal and constantly count the first and the second value, respectively.

8. The digital to time converter as claimed in claim 6, wherein the output period controller further comprises:
- a third counter counting a third value according to the reference signal and restarting a count according to the second control signal, and wherein the third value relates to the period setting parameter;
- a first logic gate performing a logic operation according to a counting result of the third counter so as to generate the second control signal; and
- a first flip-flop comprising a complementary output terminal coupled to an input terminal, and a clock input terminal coupled to the first logic gate, and outputting a signal at an output terminal as the first control signal according to a signal level of the second control signal.

9. The digital to time converter as claimed in claim 6, wherein the first output pulse generator further comprises:
- a logic circuit module coupled to the first counter and the first periodic signal generator; and
- a second flip-flop comprising an input terminal receiving the first control signal and a clock input terminal coupled to the logic circuit module, and generating a corresponding pulse as the first output signal according to an output signal of the logic circuit module and a signal level of the first control signal.

10. The digital to time converter as claimed in claim 5, wherein the first periodic signal generator further comprises a first oscillator and a first multiplexer coupled to the first oscillator, and the first oscillator comprises a plurality of output terminals outputting a plurality of oscillation signals with different phases according to a first phase offset, and wherein the second periodic signal generator further comprises a second oscillator and a second multiplexer coupled to the second oscillator, the second oscillator comprises a plurality of output terminals outputting a plurality of oscillation signals with different phases according to a second phase offset, and the first and the second multiplexer comprises, respectively, a plurality of input terminals each coupled to a corresponding output terminal of the first and the second oscillator to output the corresponding oscillation signal according to a first selection value and a second selection value.

11. The digital to time converter as claimed in claim 10, wherein the predetermined delay is expressed as:

$$T_{out} = (\alpha+\beta) \times T_S + \beta \times T_F + \gamma_S \times \Delta P_S - \gamma_F \times \Delta P_F,$$

wherein $T_{out}$ represents the predetermined delay, $\beta$ represents the first value, $(\alpha+\beta)$ represents the second value, $T_F$ represents the first period, $T_S$ represents the second period, $\gamma_F$ represents the first selection value, $\gamma_S$ represents the second selection value, $\Delta P_F$ represents the first phase offset and $\Delta P_S$ represents the second phase offset.

12. A digital to time converter for generating a first output signal and a second output signal separated by a predetermined delay, comprising:
- a first periodic signal generator generating a first periodic signal with a first period according to a reference signal;
- a second periodic signal generator generating a second periodic signal with a second period according to the reference signal;
- a first output pulse generator, comprising:
  - a first flip-flop comprising a clock input terminal coupled to the first periodic signal generator and outputting a pulse as the first output signal according to the first periodic signal;
- a second output pulse generator, comprising:
  - a counter starting a count according to the second periodic signal, wherein when the counter has counted a value, the second output pulse generator outputs a pulse as second output signal; and
- an output period controller generating a first control signal and a second control signal according to the reference signal and a period setting parameter, wherein a period of the first control signal and a period of the second control signal are both a multiple of a period of the reference signal and a period setting parameter, and wherein the first output pulse generator and the second output pulse generator generate the corresponding pulses as the first output signal and the second output signal according to a signal level of the first control signal, respectively.

13. The digital to time converter as claimed in claim 12, wherein the first output pulse generator and the second output pulse generator periodically output the corresponding pulses as the first and the second output signal according to the first control signal, and the period of the first control signal is two times as long as the period of the second control signal, and wherein the counter restarts a count according to the second control signal and constantly count the first and the second value, respectively.

14. The digital to time converter as claimed in claim 12, wherein:
the first periodic signal generator comprises:
a first phase-locked loop comprising a first oscillator having a plurality of output terminals to output a plurality of oscillation signals with different phases according to a first phase offset, wherein the reference signal is a reference signal of the first phase-locked loop; and
a first multiplexer comprising a plurality of input terminals each coupled to one of the output terminals of the first oscillator, and outputting one oscillation signal as the first periodic signal according to a first selection value; and
the second periodic signal generator comprises:
a second phase-locked loop comprising a second oscillator having a plurality of output terminals to output a plurality of oscillation signals with different phases according to a second phase offset, wherein the reference signal is a reference signal of the second phase-locked loop; and
a second multiplexer comprising a plurality of input terminals each coupled to one of the output terminals of the second oscillator, and outputting one oscillation signal as the second periodic signal according to a second selection value.

15. The digital to time converter as claimed in claim 14, wherein the predetermined delay is expressed as:

$$T_{out} = \alpha \times T_S + \gamma_S \times \Delta P_S - \gamma_F \times \Delta P_F$$

wherein $T_{out}$ represents the predetermined delay, $\alpha$ represents the count value, $T_S$ represents the second period, $\gamma_F$ represents the first selection value, $\gamma_S$ represents the second selection value, $\Delta P_F$ represents the first phase offset and $\Delta P_S$ represents the second phase offset.

16. The digital to time converter as claimed in claim 12, wherein:
the first periodic signal generator comprises:
a first delay-locked loop (DLL) comprising a series of first delay units to output a plurality of oscillation signals with different phases according to a first phase offset, wherein the reference signal is an input signal of the series of first delay units; and
a first multiplexer comprising a plurality of input terminals each coupled to one of the output terminals of the first delay units, and outputting one oscillation signal as the first periodic signal according to a first selection value; and
the second periodic signal generator comprises:
a second delay-locked loop comprising a series of second delay units to output a plurality of oscillation signals with different phases according to a second phase offset, wherein the reference signal is an input signal of the series of second delay units; and
a second multiplexer comprising a plurality of input terminals each coupled to one of the output terminals of the second delay units, and outputting one oscillation signal as the second periodic signal according to a second selection value.

17. The digital to time converter as claimed in claim 12, wherein the output period controller further comprises:
an output period counter counting an output period value according to the reference signal, and restarting a count according to the second control signal, wherein the output period value relates to the period setting parameter;
a first logic gate performing a logic operation according to a counting result of the output period counter so as to generate the second control signal; and
a second flip-flop comprising a complementary output terminal coupled to an input terminal, and a clock input terminal coupled to the first logic gate, and outputting a signal at the complementary output terminal as the first control signal according to a signal level of the second control signal.

18. The digital to time converter as claimed in claim 12, wherein the second output pulse generator further comprises:
a logic circuit module coupled to the counter and the second periodic signal generator; and
a third flip-flop comprising an input terminal receiving the first control signal and a clock input terminal coupled to the logic circuit module, and generating a corresponding pulse as the second output signal according to an output signal of the logic circuit module and a signal level of the first control signal.

* * * * *